(12) United States Patent
Anthony (10) Patent No.: US 8,077,070 B2
(45) Date of Patent: *Dec. 13, 2011

(54) CHARGE-DOMAIN PIPELINED CHARGE-REDISTRIBUTION ANALOG-TO-DIGITAL CONVERTER

(75) Inventor: Michael P. Anthony, Andover, MA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/723,019

(22) Filed: Mar. 12, 2010

(65) Prior Publication Data

US 2010/0164779 A1 Jul. 1, 2010

Related U.S. Application Data

(63) Continuation of application No. 12/074,706, filed on Mar. 5, 2008, now Pat. No. 7,683,820.

(60) Provisional application No. 60/904,953, filed on Mar. 5, 2007.

(51) Int. Cl.
*H03M 1/12* (2006.01)

(52) U.S. Cl. ........................................ 341/172; 341/155

(58) Field of Classification Search .................. 341/172, 341/155, 161, 162

See application file for complete search history.

(56) References Cited

U.S. PATENT DOCUMENTS

| | | | |
|---|---|---|---|
| 4,375,059 A | 2/1983 | Schlig | |
| 5,579,007 A | 11/1996 | Paul | |
| 5,671,252 A | 9/1997 | Kovacs et al. | |
| 6,972,707 B1 | 12/2005 | Anthony | |
| 7,129,881 B2 | 10/2006 | Franz | |
| 7,432,844 B2 | 10/2008 | Mueck et al. | |

OTHER PUBLICATIONS

Kyung, C-M. and Choong-Ki, K., "Pipeline Analog-to-Digital Conversion with Charge-Coupled Devices," *IEEE Journal of Solid-State Circuits*, 15(2):255-257 (Apr. 1980).

International Search Report from International Application No. PCT/US08/02933, Date of Mailing: Jul. 1, 2008.

Written Opinion of the International Preliminary Examining Authority from International Application No. PCT/US2008/02933, Date of Mailing: Apr. 3, 2009.

International Preliminary Report on Patentability from PCT/US08/02933 dated Oct. 5, 2011.

*Primary Examiner* — Peguy Jean Pierre
(74) *Attorney, Agent, or Firm* — Hamilton, Brook, Smith & Reynolds, P.C.

(57) ABSTRACT

A charge-domain pipeline of at least two stages is provided. Each stage comprises a charge-storage node, a charge-transfer circuit for conveying charge from said charge-storage node out of said stage, a charge-control capacitor connected to said charge-storage node and driven by a periodic clock voltage, a comparator which compares the voltage of said charge-storage node to a reference voltage, and a digital latch which latches the state of said comparator output under control of a second periodic clock voltage and provides a latched digital output from said stage. The second stage of the pipeline further includes a first charge-redistribution capacitor connected to the charge-storage node of the second stage and driven by a conditional voltage responsive to the latched digital output from the first stage. The charge output from each stage of said pipeline is substantially similar to the charge input to said stage.

20 Claims, 11 Drawing Sheets

CHARGE-DOMAIN PIPELINED CHARGE-REDISTRIBUTION ANALOG-TO-DIGITAL CONVERTER

RELATED APPLICATION(S)

This application is a Continuation of U.S. application Ser. No. 12/074,706, filed Mar. 5, 2008, now U.S. Pat. No. 7,683,820, which claims the benefit of U.S. Provisional Application No. 60/904,953, filed on Mar. 5, 2007. The entire teachings of the above applications are incorporated herein by reference.

BACKGROUND OF THE INVENTION

In charge-domain signal-processing circuits, signals are represented as charge packets. These charge packets are stored, transferred from one storage location to another, and otherwise processed to carry out specific signal-processing functions. Charge packets are capable of representing analog quantities, with the charge-packet size in coulombs being proportional to the signal represented. Charge-domain operations such as charge-transfer are driven by periodic clock voltages, providing discrete-time processing. Thus, charge-domain circuits provide analog, discrete-time signal-processing capability. This capability is well-suited to performing analog-to-digital conversion using pipeline algorithms. Charge-domain circuits are implemented as charge-coupled devices (CCDs), as MOS bucket-brigade devices (BBDs), and as bipolar BBDs. The present invention pertains to MOS and bipolar BBDs.

Charge-redistribution analog-to-digital converters (ADCs) implement a successive-approximation A/D conversion algorithm by iterated comparison and conditional capacitor switching in a single stage. They are capable of providing very high precision and resolution (up to 18 bits in currently-known implementations) at relatively low sample rates, with low power consumption.

Pipelined analog-to-digital converters (ADCs) are commonly used in applications requiring high sample rates and high resolution. Pipelined ADCs implement the successive-approximation algorithm by resolving one or several bits at each pipeline stage, subtracting the quantized estimate from the signal at that stage, and propagating the residue to the next pipeline stage for further processing. Pipelined ADCs have been implemented using a variety of circuit techniques, including switched-capacitor circuits and charge-domain circuits. The present invention pertains to charge-domain pipelined ADCs.

SUMMARY OF THE INVENTION

Typical charge-redistribution ADCs resolve a sampled input signal voltage by implementing a successive-approximation algorithm in a single stage, requiring multiple clock cycles to process each sample. Consequently the sample rate of such an ADC is limited to a maximum of $1/N^{th}$ of the clock rate, where N is the resolution in bits of the ADC. Power consumption of charge-redistribution ADCs for a given sample rate can approach the theoretical minimum for A/D conversion.

Pipelined ADCs provide higher sample rates, by resolving only a few bits at each stage, then propagating an unresolved residue signal to the next stage for further processing. Typically such converters acquire one sample of the input signal per clock cycle, thus providing approximately N-times the sample rate of charge-redistribution ADCs. They consume relatively large power, however, because of the use of active circuitry, typically op-amps, for the pipelining operation. Moreover, each such pipelining operation adds error components to the propagating residues, limiting the available resolution and linearity of such ADCs.

In one embodiment, an analog-to-digital converter is implemented in at least two stages. The first stage has a first charge storage device, a first comparator, a first digital charge storage device and a first charge transfer device. The first charge storage device stores an input charge that corresponds to an analog input signal. The first comparator compares reference voltage against a voltage corresponding to the input charge as stored at the first charge storage device, to provide a first comparison signal. The first digital storage device, in turn, stores the first comparison signal as the first digital output signal. The first charge transfer device also transfers the stored input charge out of the first stage.

The second stage has a second charge storage device, a charge redistribution device, a second comparator, and a second digital storage device. The second charge storage device stores the stored input charge as received from the first charge transfer device of the first stage. The charge redistribution device provides a redistribution charge that depends on the first comparison signal. The second comparator compares a reference voltage with the stored input charge, and the redistribution charge, to provide a second comparison signal. Finally, the second digital storage device is for storing the second comparison signal to provide a second digital output signal.

In other embodiments, a method for converting an analog input to digital outputs proceeds as follows. An input charge is stored at a first charge storage device, the input charge corresponding to the analog input. Charge stored as the input charge is then compared to a reference, to provide a first comparison result. The first comparison result is in turn used as a first digital output. The input charge is also transferred to a second charge storage device along with a redistribution charge to a third charge storage device. The amount of redistribution charge depends on the first step of comparing. Finally, a second step of comparing charge, as stored by the second charge storage device and the third charge storage device, is performed against a reference. This then provides a second comparison result which is used as a second digital output.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows. The teachings of all patents, published applications and references cited herein are incorporated by reference in their entirety.

Prior-art charge-redistribution ADCs have been implemented in a single stage, in which the signal input voltage is sampled onto a common node shared by an array of capacitors. The capacitors are then sequentially switched between reference voltages, in accordance with a successive-approximation algorithm. This capacitor-switching process re-distributes the sampled charge among the various capacitors of the array, resulting in a voltage change at the common node. At each step of the algorithm, the resulting common-node voltage is compared against a reference voltage, with the comparison result governing the next capacitor-switching event. This A/D conversion process is limited in sample rate, because the entire multi-step successive-approximation process must be completed for a given sample before the next sample is acquired.

In prior-art pipelined ADCs, each stage carries out operations similar to those in a charge-redistribution ADC, i.e., comparison and conditional capacitor switching. However, instead of carrying out all steps of the successive-approximation algorithm in a single stage, as is done in charge-redistribution ADCs, a pipelined ADC resolves only a small number of bits in each stage (typically in a single clock cycle), then subtracts charge corresponding to the resolved bits and propagates the residue to the next stage. Successive steps of A/D conversion, with a few bits resolved at each step, are carried out in successive pipeline stages.

Embodiments of the present invention combines aspects of these two ADC architectures in a charge-domain implementation. In order to make clear its operating principle, the basic principles of a charge-domain pipeline are first described. The ADC of the present invention is then described by reference to this pipeline description.

The charge-domain pipelines employed in the present invention are of the bucket-brigade device (BBD) type. Such pipelines employ charge-transfer circuits to convey charge from each stage to the next. MOS and bipolar implementations of these circuits, using either electrons or holes as the signal-charge carriers, are known. Some examples of such circuits are described in a previous patent application by the same inventor (U.S. Provisional Patent Application No. 60/809,485, filed May 31, 2006 entitled "Boosted Charge Transfer Pipeline"). In the following description, the charge-transfer circuits are treated as abstract objects, since details of their operation are not pertinent to the present invention. Negative charge-carriers (electrons) are assumed for purposes of discussion.

Figure 1:
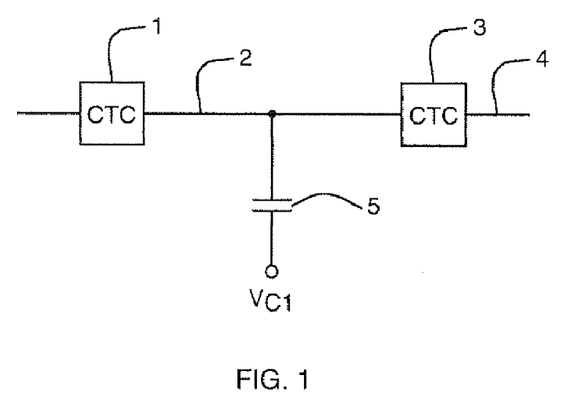
FIG. 1 shows a simplified circuit diagram of a BBD charge-pipeline stage.

The basic principle of a BBD pipeline of the general type employed in this invention is described with the aid of FIG. 1, which depicts a single stage of such a pipeline. In this stage charge is stored on capacitor 5, which is connected between storage node 2 and voltage $V_{C1}$. Charge enters the stage via charge-transfer circuit 1, and later exits the stage via charge-transfer circuit 3. Voltage $V_{C1}$ is a digital clock signal which controls the timing of charge processing in the stage. Other digital clock signals, not shown, may be used to control the activity of the charge-transfer circuits.

Figure 2:
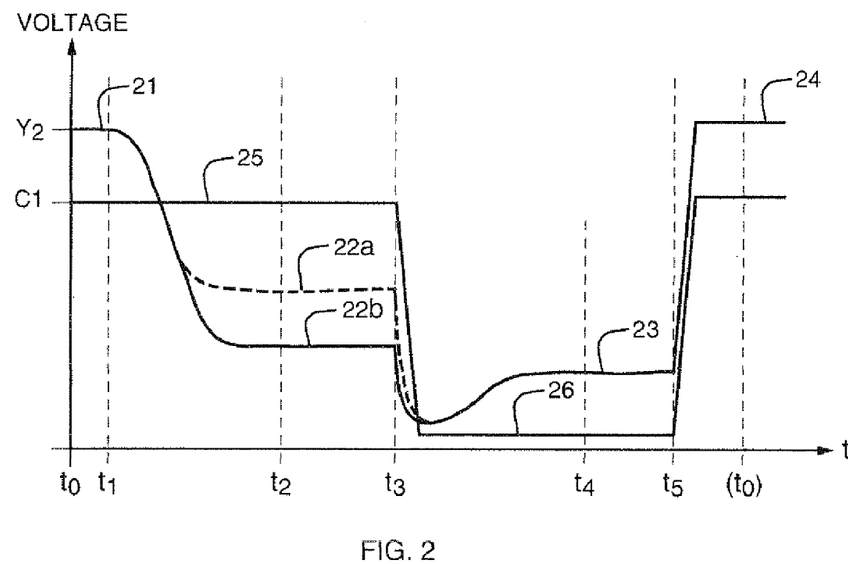
FIG. 2 illustrates voltage waveforms associated with FIG. 1.

Operating waveforms of the pipeline stage are shown in FIG. 2. At time $t_0$ clock voltage $V_{C1}$ has a positive value 25. $V_2$, the voltage of storage-node 2 in FIG. 1, is also at a high initial voltage 21. At $t_1$ negative charge begins to be transferred from the previous stage (to the left of FIG. 1) via charge-transfer circuit 1 into the stage shown. As this negative charge accumulates on capacitor 5, $V_2$ falls to a more negative value. The voltage of node 2 settles to a relatively high value 22A if a relatively small negative charge was transferred; with a larger charge transferred, node 2 settles to a more negative voltage 22B. At time $t_2$ charge transfer into the stage is complete. The voltage of node 2 is related to the charge by the well-known expression Q=CV, where is the total capacitance of node 2. In FIG. 1, C is comprised of $C_5$, the capacitance of capacitor 5, plus any parasitic capacitance of node 2; such parasitic capacitance is usually small and is neglected in this discussion.

Charge transfer out of the stage begins at time $t_3$ when clock voltage $V_{C1}$ switches to a low state, voltage 26. Capacitor 5 couples this voltage transition to node 2, driving $V_2$ low as well. Charge-transfer circuit 3 absorbs charge from capacitor 5, limiting the negative excursion of node 2, and eventually causing node 2 to settle to voltage 23 at $t_4$. Voltage 23 is a characteristic of charge-transfer circuit 3, and is independent of the amount of charge which had been stored on node 2. Charge-transfer circuit 3 transfers the charge absorbed from capacitor 5 to node 4 which is part of the stage following the one shown. After $t_4$ charge transfer is complete.

Finally, at time $t_5$, clock voltage $V_{C1}$ returns to its initial state (voltage 25). Its positive-going transition is coupled to node 2 by capacitor 5, raising node 2 to voltage 24. Neglecting parasitic capacitance, no charge flows onto or off of node 2 during this transition; the voltage change of $V_2$ is therefore equal to the voltage change of $V_{C1}$ during the transition at $t_5$. Since $V_2$'s value at the start of this transition, voltage 23, is independent of charge processed, voltage 24 is likewise independent of charge processed. This transition completes the operating cycle; the resulting voltage 24 at node 2 is thus the initial voltage for the next cycle. Thus the initial voltage state of the stage is constant cycle-to-cycle, and voltage 21=voltage 24. Consequently the initial and final charge on node 2 are also equal, and the charge transferred out is equal to the charge transferred in.

In summary: charge is transferred into the stage shown in FIG. 1 during $t_1$-$t_2$; between times $t_2$ and $t_3$ it is temporarily stored on capacitor 5, and is manifested as the value of $V_2$; during times $t_3$-$t_4$ this charge is completely transferred to the next stage; at $t_5$ the stage returns to its initial state, ready again to receive incoming charge. Thus the basic stage shown acts as a shift register for analog charge packets.

It should be understood that practical circuits depart in various details from this idealized description. Such departures include non-zero parasitic capacitance and imperfect charge transfer, for example. These effects, however, do not change the basic operating principles described above; and these principles can be applied in practical circuits with sufficient accuracy for useful purposes. Consequently such non-ideal effects are not considered in the following descriptions.

Conventional BBD charge pipelines have generally employed simple two-phase digital clock signals which simultaneously control the charge-storage capacitors and the charge-transfer circuits. Pipeline circuits such as that of FIG. 1 and others described below also operate using a two-phase clocking system. In these circuits, however, it is desirable to provide independent control of the activity of the charge-transfer circuits and of other clocked events in the stage such as capacitor switching. For this reason, the circuits of the present invention employ additional clock signals which control charge-transfer circuit activity. These signals and their function will be explained with the aid of FIGS. 3 and 4.

Figure 3:
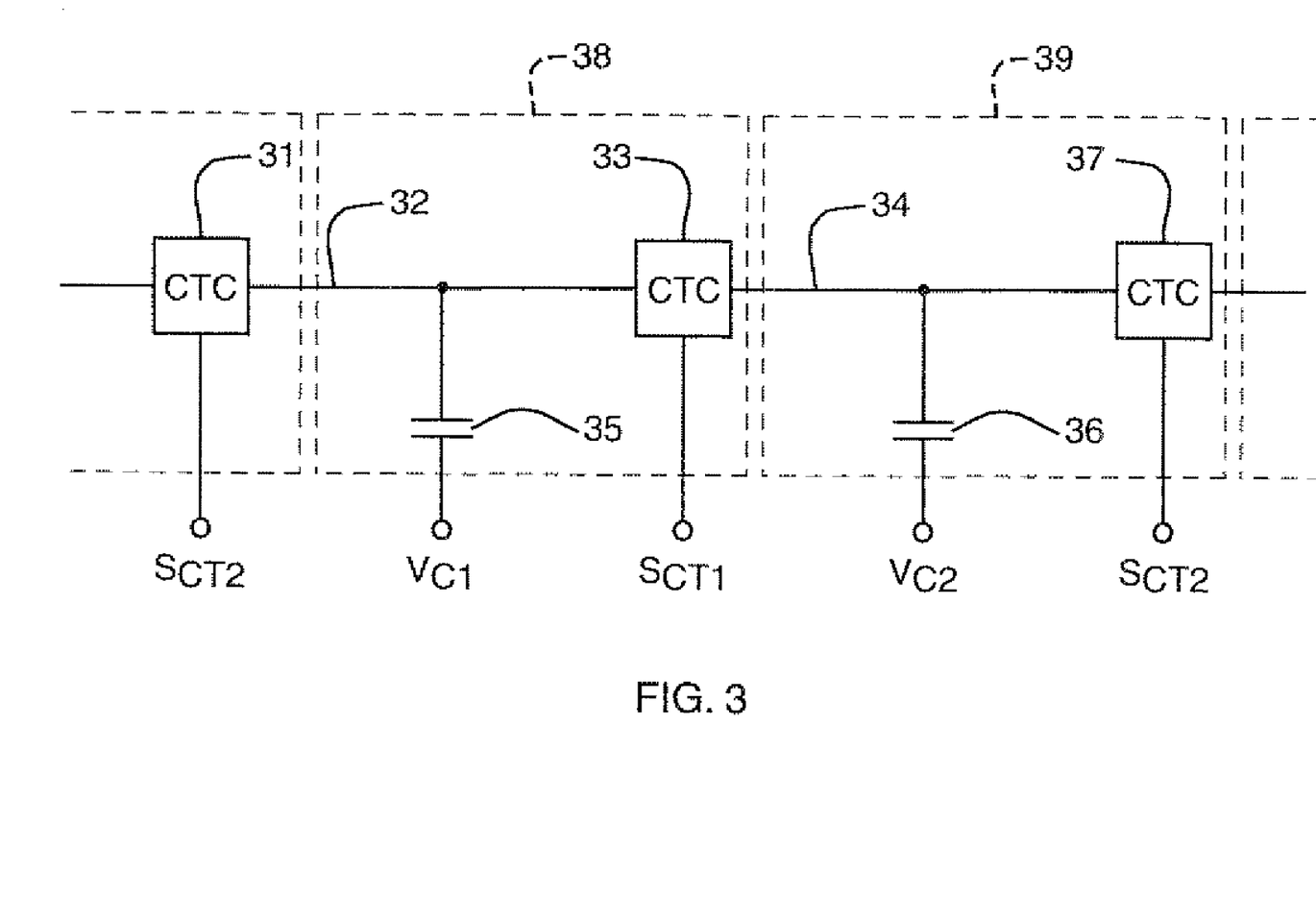
FIG. 3 shows a two-stage BBD charge pipeline.

FIG. 3 shows a pipeline segment containing two successive stages, each like the basic pipeline stage of FIG. 1. This pipeline segment consists of first charge-transfer circuit 31, part of the previous pipeline stage which is not shown; first storage node 32, first capacitor 35, and charge-transfer circuit 33, together comprising first pipeline stage 38; and second storage node 34, second capacitor 36, and charge-transfer circuit 37, together comprising second pipeline stage 39. Clock voltages $V_{C1}$ and $V_{C2}$ drive the two capacitors respectively; and digital clock signals $S_{CT1}$ and $S_{CT2}$ control the charge-transfer circuits.

Figure 4:
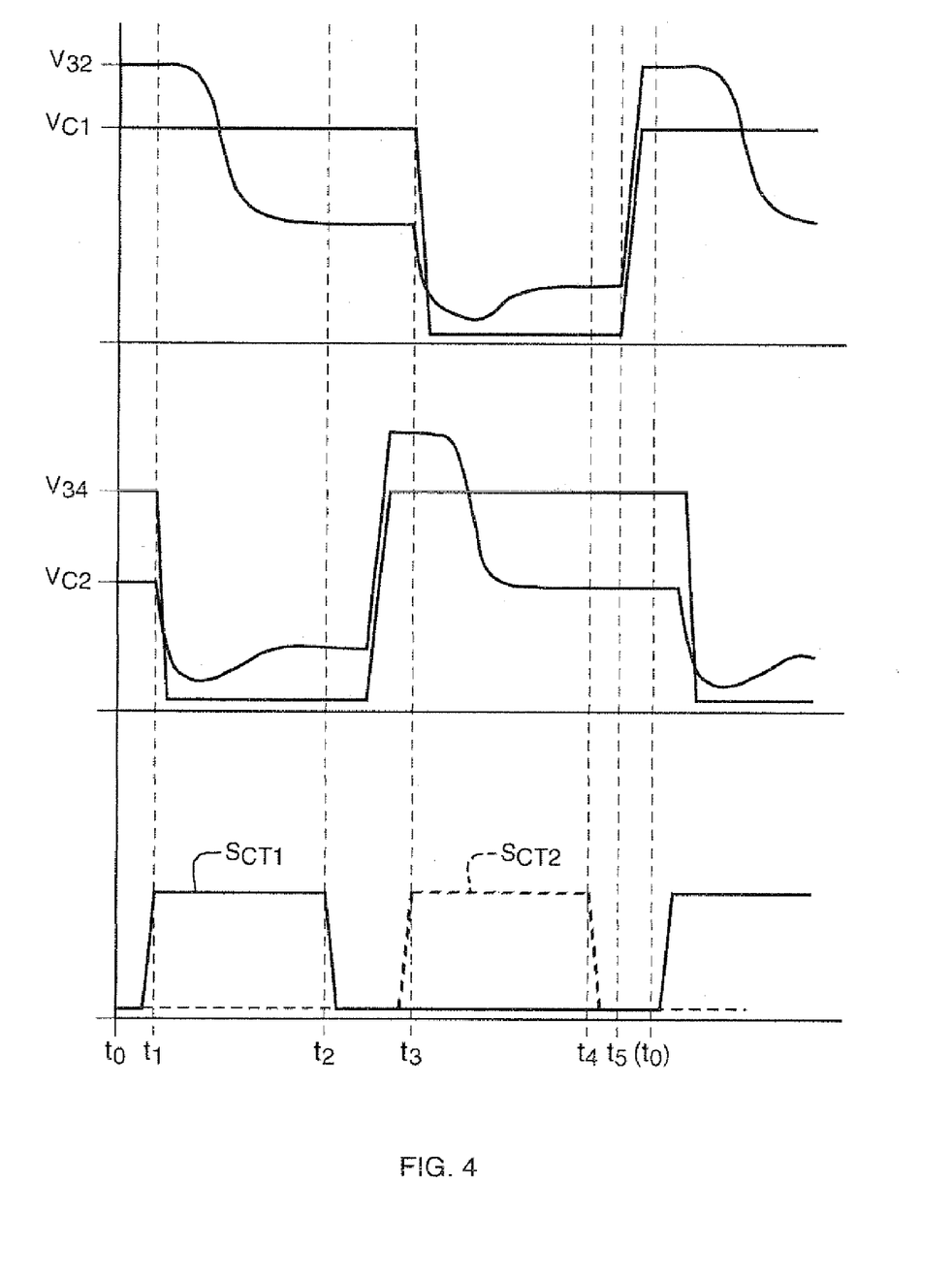
FIG. 4 illustrates voltage waveforms associated with FIG. 3.

The waveforms associated with the operation of the circuit of FIG. 3 are shown in FIG. 4. The waveforms pertaining to first stage 38 in FIG. 3, $V_{32}$ and $V_{C1}$, are identical with those of $V_2$ and $V_{C1}$ respectively in FIG. 2. The waveforms pertaining to second stage 39 in FIG. 3, $V_{34}$ and $V_{C2}$, are similar, but shifted by one-half of the clock cycle from those of the first stage. Thus the two stages of FIG. 3 operate on alternate half-cycles of the complete clock cycle. During the first half-cycle shown, when charge is transferring via charge-transfer circuit 31 into first stage 38 in FIG. 3, charge is transferring via charge-transfer circuit 37 out of second stage 39 (into the next stage, not shown). Likewise, during the second half-cycle, while charge is transferring out of first stage 38 via charge-transfer circuit 33, it is being transferred into second stage 39.

In order to control the direction of charge transfer, it is necessary to selectively enable the appropriate charge-transfer circuits. The digital signals $S_{CT1}$ and $S_{CT2}$ provide this control. As shown in FIG. 4, $S_{CT2}$ is asserted (high) during the interval $t_1$-$t_2$. This control signal enables charge-transfer circuits 31 and 37, which are active during this interval as described above. During the corresponding interval in the second half-cycle, $t_3$-$t_4$, $S_{CT1}$ is asserted, enabling charge-transfer circuit 33. The exact means by which the digital signals $S_{CT1}$ and $S_{CT2}$ act to control the activity of the charge-transfer circuits is not pertinent to this invention. Some examples of such control are described in the aforementioned patent application ("Boosted Charge-Transfer Pipeline").

The two-phase operating mode just described is used in all of the pipeline circuits described below, together with control (by signals equivalent to $S_{CT1}$ and $S_{CT2}$) of the charge-transfer circuits. In the interest of clarity, these details are not repeated in subsequent figures or descriptions.

In order to form the ADC of the present invention from a pipeline composed of stages similar to FIG. 1, two operations in addition to charge storage and charge transfer are required: charges must be compared to a reference value, typically another charge; and conditional redistribution of charge on the storage nodes must be carried out. In the ADC of this invention, one or both of these operations are carried out in each of several pipeline stages. Implementation of these operations is explained below, beginning with charge redistribution.

Charge redistribution, as employed in the ADC of this invention, is described with reference to FIGS. 5 and 6. For the purposes of this discussion, a single-ended stage is shown. In practical ADC designs, differential operation is usually preferred; both modes are possible within the scope of this invention. The pipeline stage shown in FIG. 5 retains all the elements shown in FIG. 1, and includes one new element: capacitor 6 (with value $C_6$) connected between charge-storage node 2 and voltage $V_{QR1}$. FIG. 6 shows the operating waveforms of the circuit of FIG. 5.

The waveforms of FIG. 6 are identical to those shown in FIG. 2, except for the time interval $t_{3A}$-$t_{3B}$, discussed below. As in FIG. 2, charge is transferred into the stage between $t_1$ and $t_2$, causing $V_2$ to fall in proportion to the incoming charge, settling at voltage 42. The change in $V_2$ due to incoming charge is inversely proportional to the total capacitance of node 2, which in FIG. 5 is $C=C_5+C_6$. As in FIG. 2, charge transfer out of the stage begins at $t_3$, driven by the negative transition of $V_{C1}$. By $t_4$, $V_2$ settles to voltage 43 which is independent of the charge previously on node 2, and charge transfer out of the stage is complete. At $t_5$ $V_{C1}$ returns to its initial high state (voltage 45), completing the stage's operating cycle.

Figure 5:
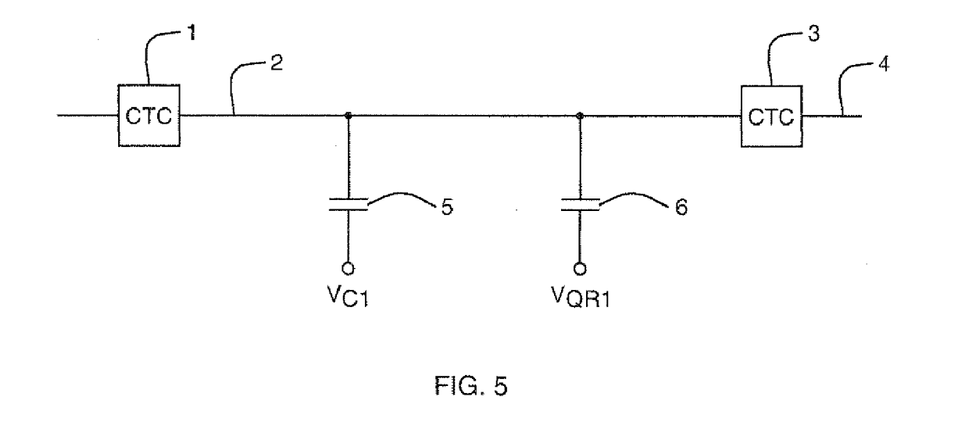
FIG. 5 shows a BBD charge-pipeline stage including conditional charge redistribution.
Figure 6:
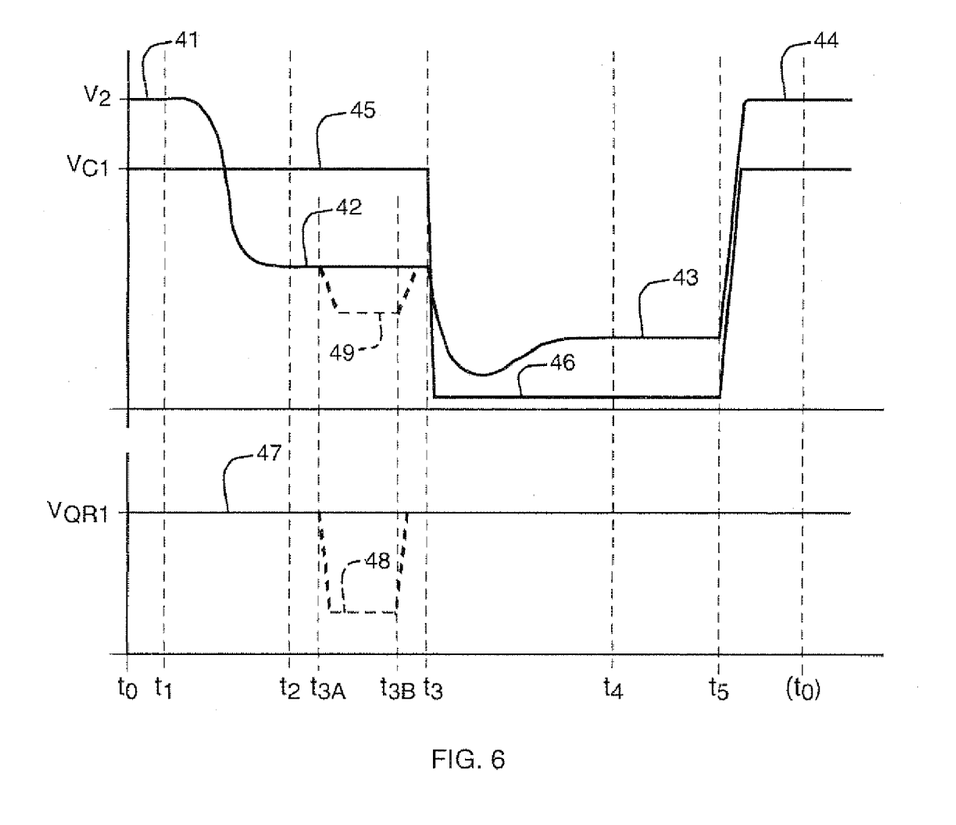
FIG. 6 illustrates voltage waveforms associated with FIG. 5.

Between $t_{3A}$ and $t_{3B}$ the new features of FIG. 5 come into play. Voltage $V_{QR1}$ is initially at voltage 47. At time $t_{3A}$ voltage $V_{QR1}$ conditionally switches from voltage 47 to voltage 48. The term 'conditionally' as used here indicates that $V_{QR1}$ either switches as stated or else it remains at voltage 47; these outcomes are shown as dashed and solid lines respectively in FIG. 6. This conditional transition of $V_{QR1}$ is coupled via $C_6$ to node 2 where, because of capacitive division, it produces a similar but smaller voltage change. The voltage at node 2 changes to voltage 49 (dashed line) if $V_{QR1}$ switches, and remains at voltage 42 (solid line) if it does not. At time $t_{3B}$ $V_{QR1}$ is unconditionally restored to voltage 47; consequently $V_2$ returns to voltage 42. Voltage $V_2$ is thus dependent on both input charge and on the (conditional) state of $V_{QR1}$ between $t_{3A}$ and $t_{3B}$, but is dependent only on the input charge after $t_{3B}$.

Applying the relationship Q=CV to the conditions of FIGS. 5 and 6, and employing the notation v41 for "voltage 41", v42 for "voltage 42", etc., we can express the voltage $V_2$ of charge-storage node 2 at $t=t_2$ as:

$$V_2 = v_{42} = v_{41} + Q_{IN}/C \qquad \text{Equation 1}$$

where $Q_{IN}$ is the incoming charge from the previous stage (negative in this example), and $C=C_5+C_6$ is the total capacitance at node 2.

After the conditional transition of $V_{QR1}$ ($t>t_{3A}$), the node-2 voltage becomes:

$$V_2 = v_{42} + \Delta V_{QR1} C_6/C = v_{41} + (Q_{IN} + \Delta V_{QR1} C_6)/C \qquad \text{Equation 2}$$

where $\Delta V_{QR1}$ is the change in voltage $V_{QR1}$ at $t_{3A}$, having the value either ($v_{48}$-$v_{47}$) or zero. The corresponding change in $V_2$, $\Delta V_{QR1} C_6/C$, is due to capacitive division between capacitor 6 and the total capacitance of the node. This change in voltage due to capacitive division is alternatively known as 'charge-redistribution'. Equation 2 shows quantitatively the dependence of $V_2$ on both input charge and the conditional change in $V_{QR1}$. In the following discussion, conditionally-switchable voltages such as $V_{QR1}$ are referred to as 'charge-redistribution voltages'; the capacitors such as capacitor 6 driven by these voltages are referred to as 'charge-redistribution capacitors'.

Figure 7:
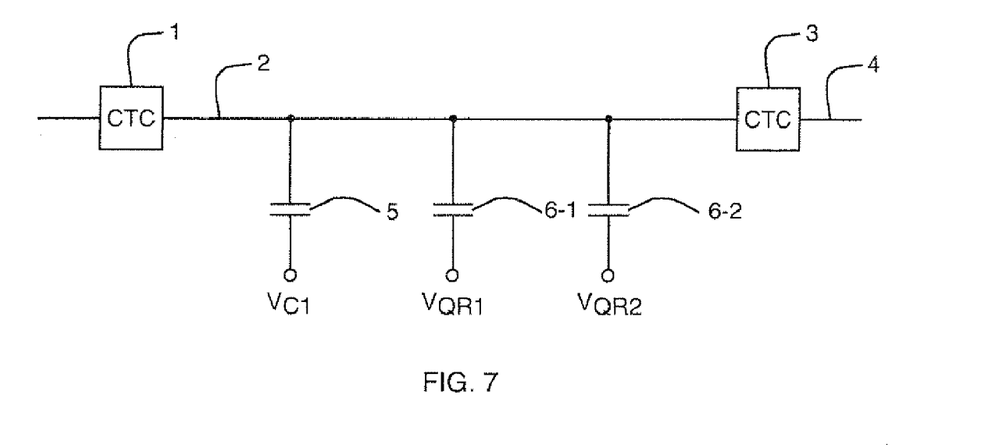
FIG. 7 shows a BBD charge-pipeline stage with two independent charge-redistribution capacitors.

The charge-redistribution principle shown in FIGS. 5 and 6 and expressed in Equation 2 can be extended as shown in the circuit of FIG. 7. This circuit is identical to that of FIG. 5, except that capacitor 6 has here been re-named 6-1, and a second charge-redistribution capacitor 6-2 and voltage source $V_{QR2}$ have been added. For convenience in the following analysis, the capacitances of capacitors 6-1 and 6-2 are represented as $C_1$ and $C_2$ respectively. Operation of this circuit is as shown in FIG. 6, except that $V_{QR1}$ and $V_{QR2}$ can be switched independently at $t_{3A}$. (Both are returned to their original voltages, equivalent to voltage 47 in FIG. 6, at $t_{3B}$.) With these changes the total capacitance at node 2 becomes $C = C_5 + C_1 + C_2$. Expressing the (independent) changes in $V_{QR1}$ and $V_{QR2}$ as $\Delta V_{QR1}$ and $\Delta V_{QR2}$ respectively, we obtain, by extension from Equation 2, the voltage at node 2 between times $t_{3A}$ and $t_{3B}$:

$$V_2 = v_{42} + \Delta V_{QR1} C_1 / C + \Delta V_{QR2} C_2 / C \qquad \text{Equation 3}$$
$$= v_{41} + (Q_{IN} + \Delta V_{QR1} C_1 + \Delta V_{QR2} C_2) / C$$

This principle can be extended indefinitely, with as many charge-redistribution capacitors and independently-switchable voltages as desired. The resulting voltage at node 2 then resembles Equation 3, with one term of the form $\Delta V_{QRk} C_k$ for each such capacitor, and C being the total capacitance. In the case of zero charge-redistribution capacitors, as in FIG. 1, Equation 3 reduces to Equation 1, and the total stage capacitance is simply that of the single capacitor 5 in FIG. 1.

In FIG. 5 above the quantity $(v_{48}-v_{47})$ is shown as negative. This sign choice is merely an example: Equations 2 and 3 (and the indicated extension to more capacitors) remain valid for either choice of sign. Similarly, the individual values of $\Delta V_{QR1}$, $\Delta V_{QR2}$, etc. can have different values or signs. Likewise, the voltage to which $V_{QR1}$ etc. transition at $t_{3B}$ need not be the original voltage ($v_{47}$ in the examples given). It must, however, be a voltage which is unconditional; that is, the final value of $V_{QR1}$ etc. after $t_{3B}$ must be independent of the transition at $t_{3A}$.

The exact position of times $t_{3A}$ and $t_{3B}$ are not critical to the operation of the circuits of FIGS. 5 and 7. The conditional transitions of $V_{QR1}$ etc. ($t_{3A}$ in FIG. 6) can take place as early as $t_1$, and the transition of $V_{QR1}$ etc. to their unconditional final states ($t_{3B}$ in FIG. 6) can take place as late as $t_3$. Equations 2 and 3 become valid at the later of $t_2$ and $t_{3A}$, and remain valid until $t_{3B}$.

Figure 8:
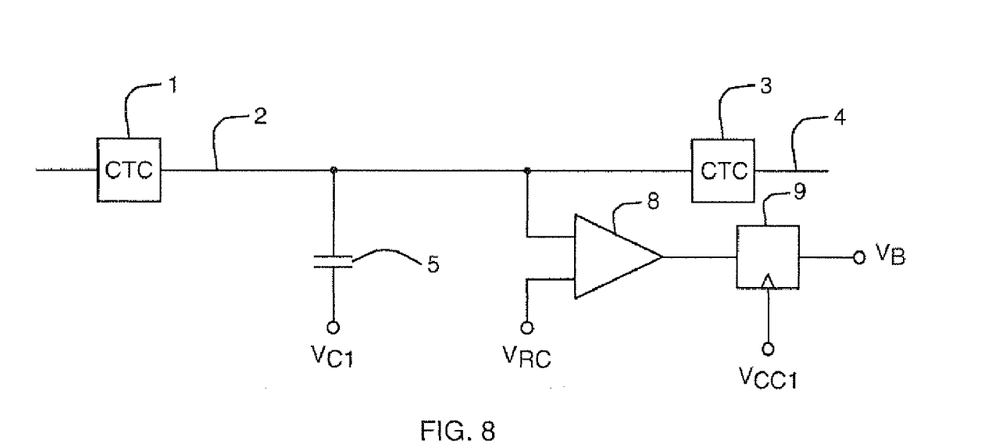
FIG. 8 shows a single-ended BBD charge-pipeline stage including charge comparison.

The second operation required for construction of an ADC according to this invention is charge comparison. FIG. 8 shows a circuit which provides charge comparison in a pipeline stage. The circuit of FIG. 8 may be comparable to that of FIG. 1, with the addition of voltage comparator 8 and latch 9. Comparator 8 compares the voltage of node 2 with a reference voltage $V_{RC}$. The voltage at node 2 after $t_2$ depends on the amount of charge transferred into the stage, as expressed in Equation 1. Because of this dependence, voltage comparator 8 accomplishes a comparison of charge on node 2 vs. a reference. Latch 9 captures the result of this comparison at a time between $t_2$ and $t_3$ defined by the digital clock signal $V_{CC1}$, and provides a digital output voltage $V_B$.

As was mentioned above, many practical charge-domain pipelined ADCs employ differential circuitry. In such circuitry, signals are represented by pairs of charges whose difference is proportional to the signal. This arrangement permits representation of bipolar signals with unipolar charge packets, and can also provide dynamic range and noise-immunity benefits.

Figure 9:
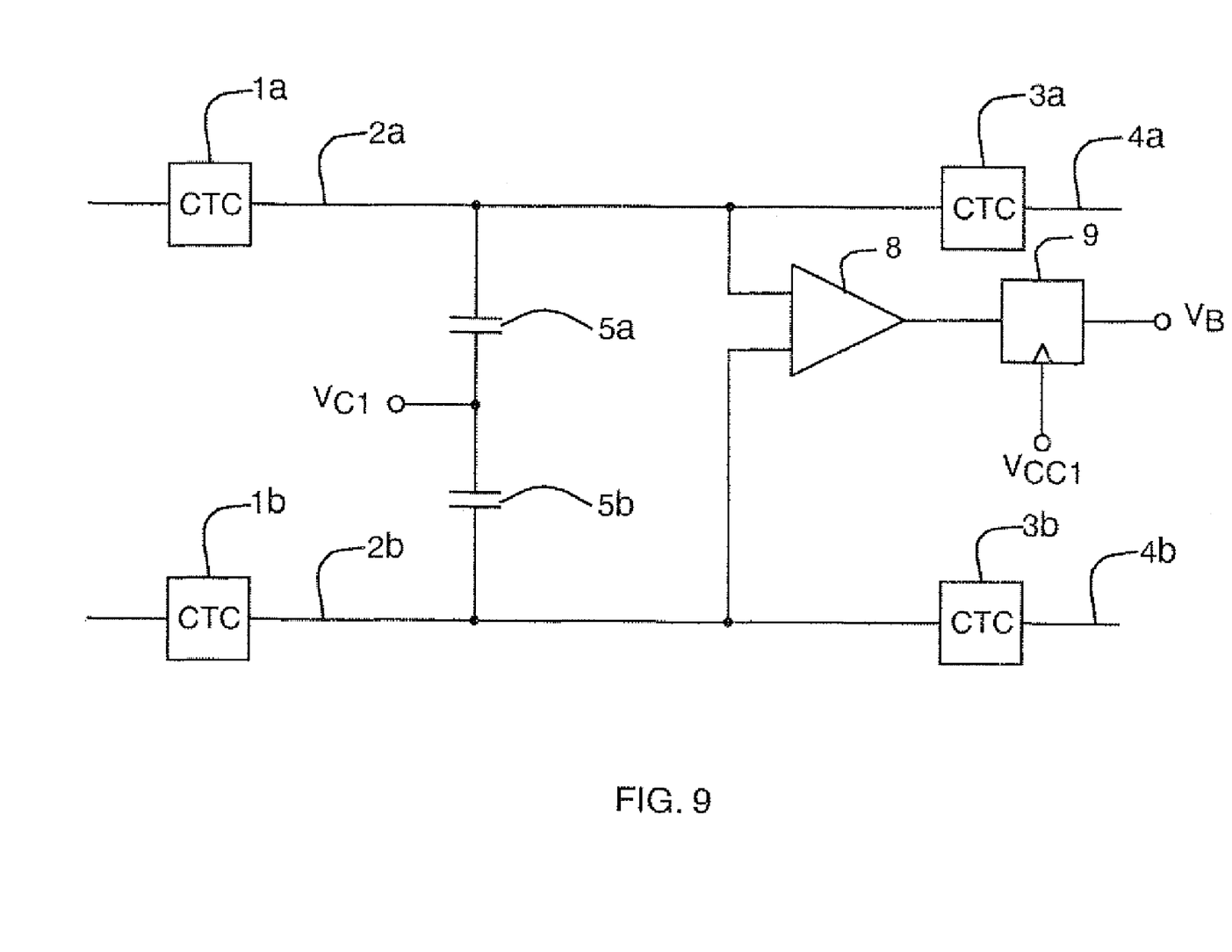
FIG. 9 shows a differential BBD charge-pipeline stage including charge comparison.

FIG. 9 illustrates a differential pipeline stage which is functionally similar to the single-ended stage of FIG. 8. The circuit of FIG. 9 contains two charge pipelines, each identical to that of FIG. 1. The upper pipeline contains elements 1A, 2A, 3A, 4A and 5A, equivalent to elements 1, 2, 3, 4, and 5 in FIG. 1. The lower pipeline contains elements 1B through 5B, also equivalent to elements 1 through 5 of FIG. 1. The latch 9 in this circuit serves the same function as in FIG. 8. In this differential configuration, however, the comparator 8 compares the voltages of the two charge storage nodes 2A and 2B, rather than comparing to a fixed reference as in FIG. 8. Thus the comparator decision in FIG. 9 is based on the sign of the differential charge signal during the $t_2$-$t_3$ interval.

Figure 10:
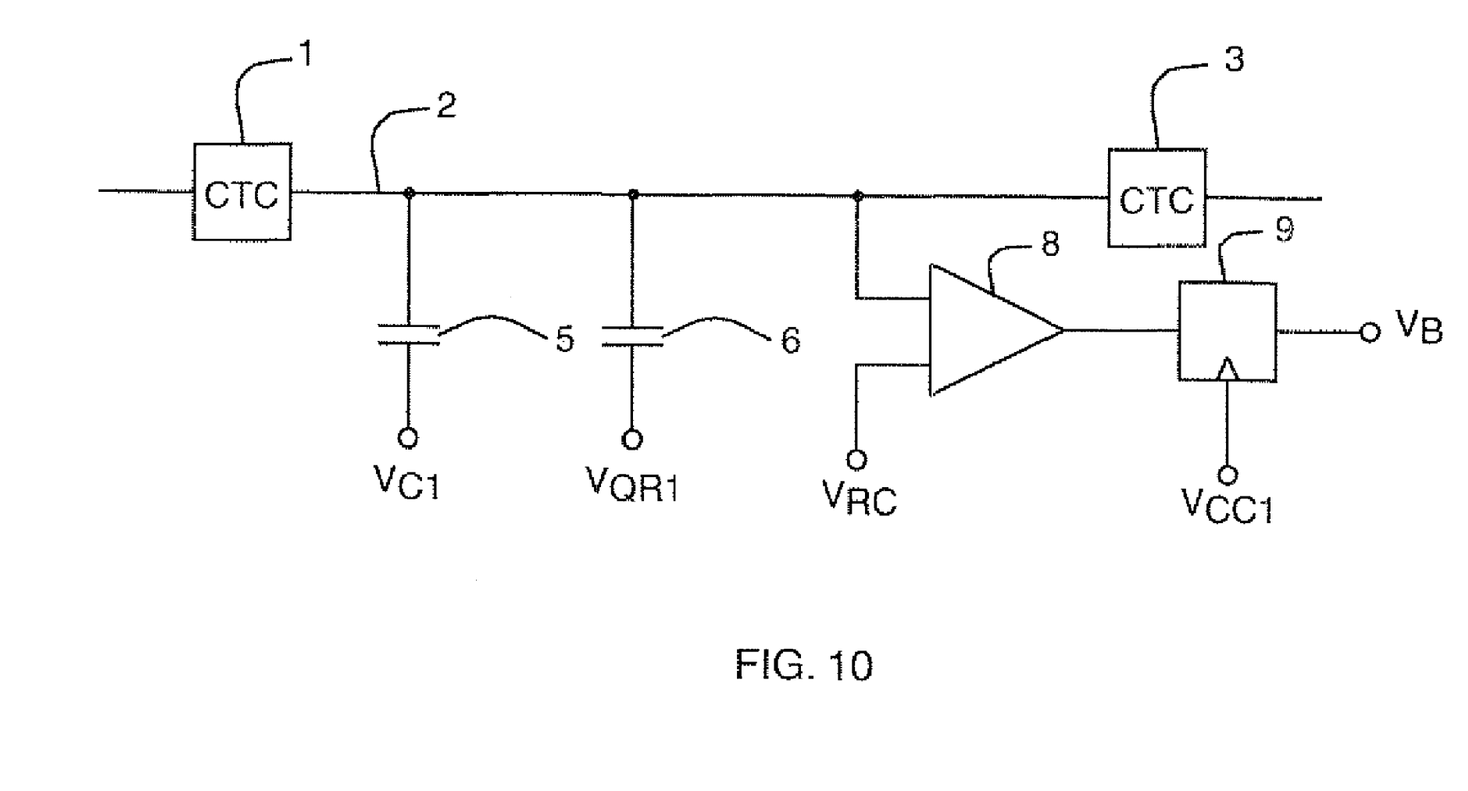
FIG. 10 shows a single-ended BBD charge-pipeline stage including conditional charge redistribution and charge comparison.

Returning to a single-ended circuit for simplicity, FIG. 10 illustrates a pipeline stage in which the charge-comparison function just described is combined with the charge-redistribution circuitry described previously. The circuit of FIG. 10 combines the elements of FIG. 8 with the charge-redistribution capacitor 6 and voltage $V_{QR1}$ from FIG. 5. With this combination, comparator 8 senses the voltage resulting from the combination of input charge to the stage and charge redistribution, as given by Equation 2. As in the circuits of FIGS. 8 and 9, the clock voltage $V_{CC1}$ determines the time at which the comparator output is latched. This time is chosen to occur in the interval during which Equation 2 is valid, as discussed above. A similar circuit combination, with an additional charge-redistribution capacitor as in FIG. 7, provides the comparator with an input signal given by Equation 3; and similarly for additional charge-redistribution capacitors.

In an ADC according to the present invention, each pipeline stage is provided with a comparator and latch like those described above. The digital output signal from each such latch constitutes one bit of the complete ADC's digital output. In addition, each such digital output is used to control the conditional charge-redistribution in the following pipeline stages, as will be shown below. In order to achieve this control, an additional circuit is required which accepts as input the digital signal and provides as output a signal similar in logic sense, timing, and amplitude to $V_{QR1}$ in FIG. 6. This circuit can be implemented using well-known methods and will not be described in detail; it will be referred to in the following description as a 'charge-redistribution driver' circuit.

Figure 11:
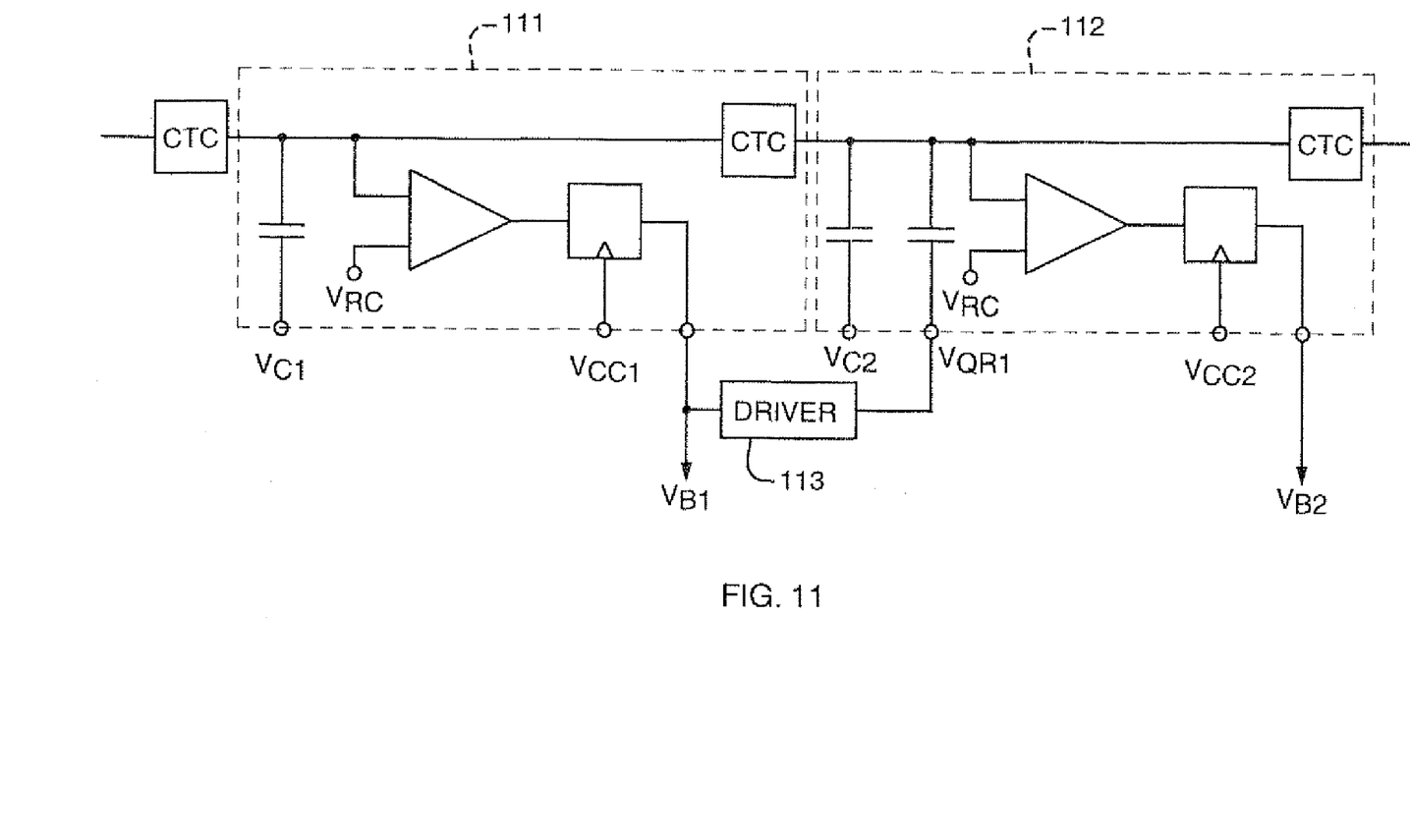
FIG. 11 shows a two-stage ADC according to the present invention.

FIG. 11 shows the first two stages of an ADC according to the present invention, which incorporates the charge-redistribution, charge-comparison, and charge-redistribution-driver circuits described above in a single-ended pipeline providing two bits of analog-to-digital conversion. The first pipeline stage 111 may be comparable to the stage of FIG. 8, and is supplied with clock phases $V_{C1}$ and $V_{CC1}$. Stage 112 is comparable to the circuit of FIG. 10, including a charge-redistribution capacitor driven by input voltage $V_{QR1}$; stage 112 is supplied with clock phases $V_{C2}$ and $V_{CC2}$. Both stages are supplied with comparator reference voltage $V_{RC}$. The latched digital outputs of stages 111 and 112 are provided as outputs $V_{B1}$ and $V_{B2}$ respectively. Charge-redistribution driver circuit 113 has $V_{B1}$ as input and $V_{QR1}$ as output.

Figure 12:
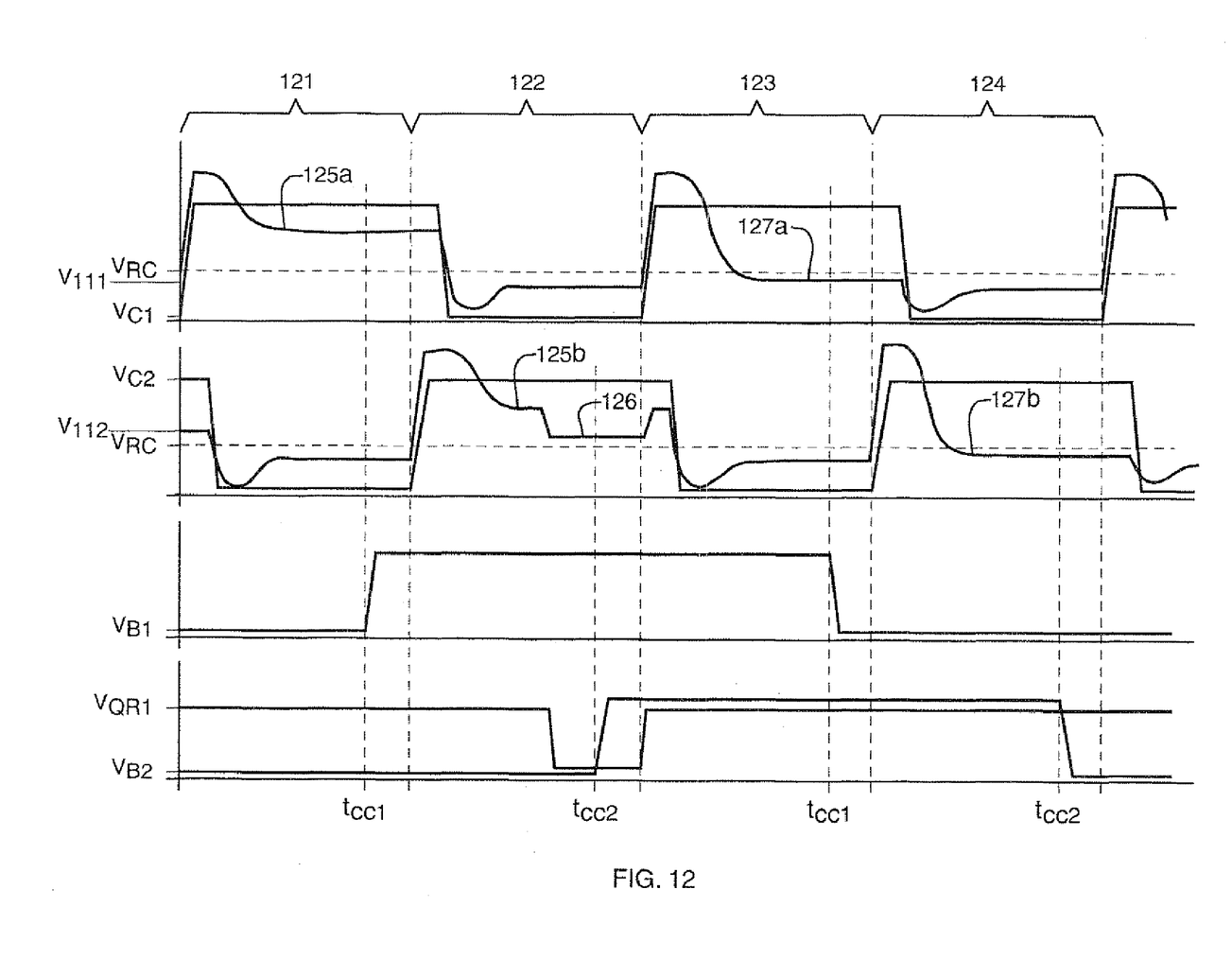
FIG. 12 illustrates voltage waveforms associated with FIG. 11.

FIG. 12 shows operating waveforms of the circuit of FIG. 11. The charge-storage node voltages in each pipeline stage, identified respectively as $V_{111}$ and $V_{112}$, are plotted in two separate panels as in FIG. 4, together with their respective charge-control clock phases $V_{C1}$ and $V_{C2}$ and the (DC) comparator reference voltage $V_{RC}$. The two-phase clocking system depicted is identical to that shown in FIG. 4. Four clock half-cycles are shown, identified as 121, 122, 123 and 124.

The passage of two successive charge packets through the pipeline can be described as follows. During the first clock half-cycle 121, a first charge packet is transferred into stage 111, causing storage-node voltage $V_{111}$ to fall to voltage 125A. During the second half-cycle 122, this charge packet is transferred from stage 111 into stage 112, causing $V_{112}$ to fall to the same level, identified as 125B. During the third half-cycle 123, the same charge is transferred out of stage 112 into the next pipeline stage, which is not shown. Meanwhile, also during half-cycle 123, a second charge packet is transferred into stage 111, causing storage-node voltage $V_{111}$ to fall to voltage 127A. During the fourth half cycle 124, the second charge packet is transferred into stage 112, causing its storage-node voltage $V_{112}$ to fall to the same voltage, identified as 127B.

Charge comparison and redistribution occur as follows. Storage-node voltages $V_{111}$ and $V_{112}$ are compared to $V_{RC}$; the comparison results are latched at the indicated times $t_{CC1}$ and $t_{CC2}$ respectively, producing digital outputs $V_{B1}$ and $V_{B2}$. (These latching times are governed by the respective latch clocks $V_{CC1}$ and $V_{CC2}$ shown in FIG. 11. They recur in each full clock cycle.) During half-cycle 121, the result of comparing $V_{111}$ to $V_{RC}$ is latched at $t_{CC1}$, resulting in a high state (digital 1) for $V_{B1}$ as shown. The value of $V_{111}$ sensed at this time is a function of the input charge, as given by Equation 1.

As shown in FIG. 11, charge-redistribution driver 113 receives $V_{B1}$ and outputs a charge-redistribution voltage signal $V_{QR1}$ which is input to stage 112. The sense of this $V_{QR1}$ signal (inverted from $V_{B1}$) and its timing (delayed from $V_{B1}$) are shown in FIG. 12. As explained above, the transition in $V_{QR1}$ causes a corresponding change in $V_{112}$, resulting temporarily in voltage 126. The $V_{QR1}$ timing shown in FIG. 12 illustrates one feature of the present invention: the comparison result of a given stage (111 in this example) governs charge-redistribution in subsequent stages such as 112.

At $t_{CC2}$ in half-cycle 122 the result of comparing $V_{112}$ with $V_{RC}$ is latched, resulting in the indicated $V_{B2}$ value (also a digital 1 in this example). Note that the $V_{112}$ voltage whose value governs this $V_{B2}$ decision includes the effects of both the input charge packet and the effect of $V_{QR1}$ switching, as given by Equation 2. If $V_{112}$ were more negative than $V_{RC}$, then $V_{B2}$ would be a digital 0.

The second charge packet is transferred into stage 111 during half-cycle 123, resulting in $V_{111}$ voltage 127A. Since $v_{127A} < V_{RC}$, the resulting $V_{B1}$ value latched at $t_{CC1}$ is a digital 0, as shown in FIG. 12. Consequently, when this second charge packet is transferred into stage 112 (resulting in $V_{112}$ voltage 127B), $V_{QR1}$ does not make a negative transition, and $V_{112}$ remains at voltage 127B throughout half-cycle 124. Since $v_{127B} < V_{RC}$, the resulting $V_{B2}$ value latched at $t_{CC2}$ in this half-cycle is a also digital 0.

Figure 13:
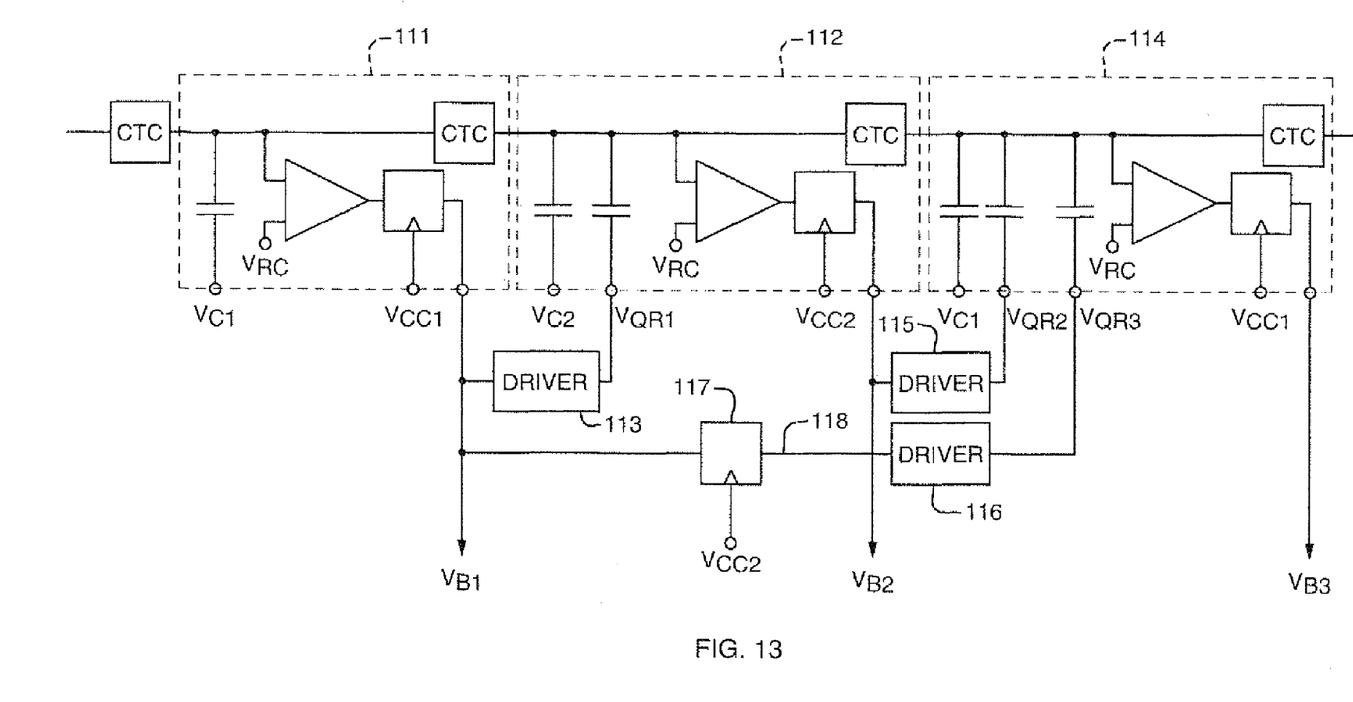
FIG. 13 shows a three-stage ADC according to the present invention.

FIG. 13 illustrates the extension of the concepts discussed above to three stages. In addition to the elements shown in FIG. 11, it includes a third pipeline stage 114, controlled (like stage 111) by clock phases $V_{C1}$ and $V_{CC1}$; two additional charge-redistribution drivers, 115 and 116; and latch 117. Pipeline stage 114 includes two charge-redistribution capacitors, controlled by two charge-redistribution voltages, $V_{QR2}$ and $V_{QR3}$. $V_{QR2}$ is the output of charge-redistribution driver 115, whose input is $V_{B2}$, the bit resolved in stage 112. $V_{QR3}$ is the output of charge-redistribution driver 116, whose input is signal 118, the output of latch 117, whose input is $V_{B1}$, the bit resolved in stage 111. Stage 114 provides $V_{B3}$ as its digital output bit.

The operation of the circuit of FIG. 13 is as follows. The first two stages, 111 and 112 operate exactly as described above. Charge packets are received as input to stage 111, transferred in turn to stage 112, to stage 114, and then out of stage 114 to the next pipeline stage (not shown). Charge redistribution in second stage 112 is governed by the bit decision made in first stage 111: the first-stage output bit, $V_{B1}$, is delayed and inverted by charge-redistribution driver 113 to produce $V_{QR1}$, as described above. Similarly, one charge-redistribution capacitor in third stage 114 is controlled by the bit decision made in second stage 112: the second-stage output bit, $V_{B2}$, is delayed and inverted by charge-redistribution driver 115 to produce $V_{QR2}$. The other charge-redistribution capacitor in third stage 114 is controlled by a delayed version of $V_{B1}$: latch 117 captures the state of $V_{B1}$ at $t_{CC2}$ (at the same time as $V_{B2}$ is being latched) to produce digital signal 118. Signal 118 in turn provides input to charge-redistribution driver 116, whose output is $V_{QR3}$.

This effect of this operation is as follows. A charge packet is transferred in to first stage 111 where the resulting voltage is compared to reference $V_{RC}$, with the comparison result provided as output $V_{B1}$. The charge packet is then transferred to second stage 112. In stage 112, a reference charge is temporarily added to the charge packet if $V_{B1}$ indicates that the packet is smaller than the (charge-equivalent) threshold. The combined charge in stage 112 is then compared to the same reference, resulting in output $V_{B2}$ which is provided as the second-stage output. The charge packet is then transferred to third stage 114. Note that the charge transferred is equal to the original input packet: the temporarily-added reference charge is removed before the transfer occurs. In stage 114, the two previous decisions regarding the same packet control the conditional addition of two independent reference charges. $V_{B2}$ is available when needed for this purpose. Latch 117 serves to propagate the first-stage bit decision ($V_B$) so that it is available when needed in third stage 114. The voltage resulting from the original charge packet plus the two conditional added charges in stage 114 is compared to reference $V_{RC}$, with the result provided as output $V_{B3}$. The net result is that at each stage, a sequentially augmented version of the input charge is compared to a fixed threshold; the bit decisions at each stage govern the conditional charge addition at all downstream stages. This functionality is suitable for implementing the well-known successive-approximation A/D conversion algorithm, with the sequential output bits $V_{B1}$, $V_{B2}$, and $V_{B3}$ being the digital result of the conversion, MSB first.

This three-stage ADC example illustrates the principal features of the present invention; the same principles can be applied to four or more stages by obvious extension. Each stage includes one more charge-redistribution capacitor than the previous one. Bit decisions are delayed at each stage by latches analogous to 117, so that at each stage the complete set of bit decisions from previous stages is available for charge-redistribution control.

Figure 14:
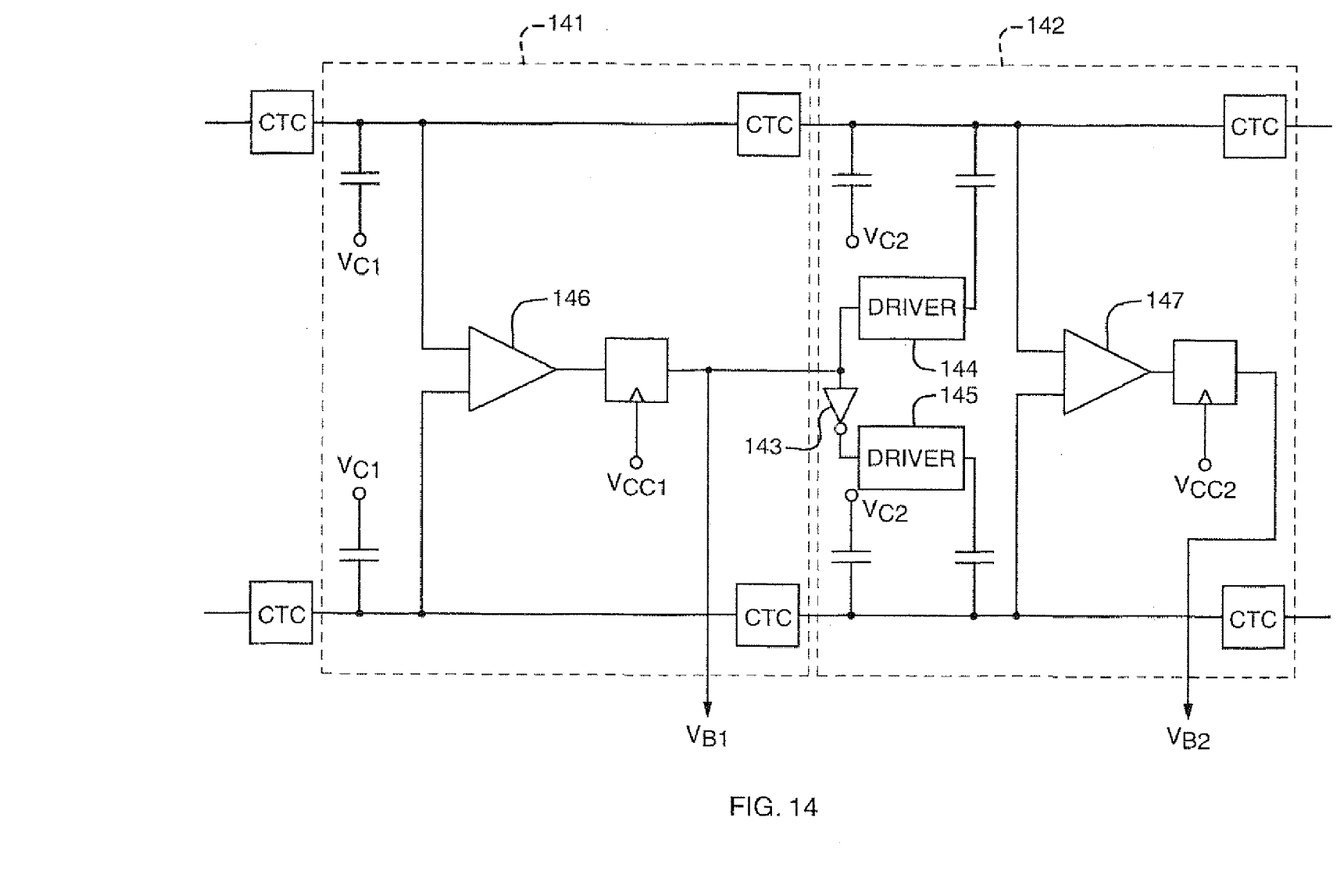
FIG. 14 shows a differential two-stage ADC according to the present invention.

In addition to the single-ended embodiment described above, the ADC of this invention can be embodied using a differential pipeline similar to the circuit of FIG. 9. As an example, FIG. 14 shows a differential implementation of the two-stage ADC circuit of FIG. 11. Stages 141 and 142 are analogous to stages 111 and 112 in FIG. 11. The clocking ($V_{C1}$, $V_{CC1}$, $V_{C2}$, and $V_{CC2}$) is identical to that in FIG. 11. The comparators 146 and 147 are similar in function to the comparators in FIG. 11, except that the comparison in FIG. 14 is between the differential charge-storage node voltages rather than between a single charge-storage node and a reference voltage. The first-stage output bit $V_{B1}$ controls conditional charge addition in the second stage as in FIG. 11. In FIG. 14, however, the two charge-redistribution drivers 144 and 145 receive complementary logic inputs: driver 144 receives $V_{B1}$ directly, while driver 145 receives its complement, provided by logic inverter 143. Thus the two logic states of $V_{B1}$ cause conditional charge addition either to the upper storage node or the lower storage node (but not both) at each cycle. This differential embodiment can be extended to further stages by analogy to the extension from FIG. 11 to FIG. 13.

While this invention has been particularly shown and described with references to example embodiments thereof, it will be understood by those skilled in the art that various changes in form and details may be made therein without departing from the scope of the invention encompassed by the appended claims.

What is claimed is:

1. An analog-to-digital converter apparatus comprising:
a first stage comprising:
a first charge storage device, for storing an input charge that corresponds to an analog input signal;
a first comparator, for comparing a reference voltage against a voltage corresponding to the input charge as stored at the first charge storage device, and in response thereto, providing a first comparison signal;
a first comparison result storage device, for storing the first comparison signal and to provide a first digital output signal; and
a first charge transfer device, for transferring the stored input charge out of the first stage;
a second stage comprising:
a second charge storage device for storing the stored input charge as received from the first charge transfer device of the first stage,
a charge redistribution device, the charge redistribution device providing a redistribution charge that depends on the first comparison signal;
a second comparator, for comparing a reference voltage with the stored input charge and the redistribution charge, to provide a second comparison signal; and
a second comparison result storage device, for storing the second comparison signal and to provide a second digital output signal.

2. The apparatus of claim 1 wherein at least one of the first and second charge storage devices is a capacitive circuit element.

3. The apparatus of claim 2 wherein the charge redistribution device comprises a capacitive circuit element.

4. The apparatus of claim 3 wherein the charge redistribution device further comprises a driver circuit coupled to the capacitive circuit element.

5. The apparatus of claim 1 wherein the second charge storage device is a capacitor having a first terminal coupled to receive the input charge and a second terminal coupled to receive a clock signal.

6. The apparatus of claim 1 wherein the first comparison result storage device is a clocked digital latch storing a first bit of an analog-to-digital conversion result.

7. The apparatus of claim 1 wherein the second comparison result storage device is a clocked digital latch storing a second bit of an analog-to-digital conversion result.

8. The apparatus of claim 1, further comprising:
a third stage comprising:
a third charge storage device for storing the stored input charge as received from the second charge transfer device of the second stage;
a second charge redistribution device, the second charge redistribution device providing a second redistribution charge that depends on the first and second comparison signal from, respectively, the first and second comparator in the first and second stages;
a third comparator, for comparing a reference voltage with the stored input charge and the second redistribution charge, to provide a third comparison signal; and
a third comparison result storage device, for storing the third comparison signal and to provide a third digital output signal.

9. The apparatus of claim 8 wherein the second charge redistribution device further comprises:
a second charge redistribution capacitor coupled to a second common node, the second charge redistribution capacitor providing a charge that depends on the first comparison signal; and
a third charge redistribution capacitor, coupled to the second common node, the third charge redistribution capacitor providing a charge that depends on the second comparison signal.

10. A method for converting an analog input to digital outputs comprising:
storing an input charge corresponding to the analog input, to provide a stored input charge;
a first step of comparing the stored input charge to a reference, to provide a first comparison result;
determining a first digital output from the first comparison result;
determining a redistribution charge depending on the first comparison result;
combining the redistribution charge and the first comparison result to provide a combined charge;
a second step of comparing the combined charge against a reference, to provide a second comparison result and;
determining a second digital output from the second comparison result.

11. The method of claim 10 further comprising:
storing the first comparison result in a digital storage device.

12. The method of claim 11 further comprising:
storing the second comparison result in a digital storage device.

13. The method of claim 10 wherein the step of storing an input charge further comprises storing the input charge in a first capacitive circuit element.

14. The method of claim 13 wherein the step of storing an input charge further comprises clocking the first capacitive circuit element.

15. The method of claim 10 wherein the step of transferring the input charge to a second charge storage device further comprises storing the input charge in a second capacitive circuit element.

16. The method of claim 15 wherein the step of transferring the input charge to a second charge storage device further comprises clocking the second capacitive circuit element.

17. The method of claim 16 wherein the step of determining a redistribution charge further comprises storing the input charge in a third capacitive circuit element.

18. The method of claim 17 wherein the step of determining a redistribution charge further comprises coupling the second and third capacitive circuit elements to a common node.

19. The method of claim 18 wherein the second step of comparing the combined charge further comprises comparing a voltage at the common node to the reference.

20. A method for analog-to-digital conversion in a multiple stage pipeline comprising:

at a first stage of the pipeline:
storing an input charge that corresponds to an analog input signal;
a first comparing step of comparing a reference voltage against a voltage corresponding to the stored input charge;
providing a first comparison signal in response to the first comparing step;
storing the first comparison signal to provide a first digital output signal;
transferring the stored input charge to a subsequent stage of the pipeline;
redistributing a redistribution charge that depends on the first comparison signal; and
at the subsequent stage of the pipeline:
a second step of storing the stored input charge as received from the first stage of the pipeline,
receiving the redistribution charge from the first stage;
a second comparing step of comparing a reference voltage with a combined charge corresponding to the stored input charge and the redistribution charge, to provide a second comparison signal; and
storing the second comparison signal to provide a second digital output signal.

* * * * *